United States Patent [19]

Kim

[11] Patent Number: 5,186,381
[45] Date of Patent: Feb. 16, 1993

[54] SEMICONDUCTOR CHIP BONDING PROCESS

[75] Inventor: Gu S. Kim, Seoul, Rep. of Korea

[73] Assignee: Samsung Electronics, Co., Ltd., Suweon, Rep. of Korea

[21] Appl. No.: 756,911

[22] Filed: Sep. 9, 1991

[30] Foreign Application Priority Data

Apr. 16, 1991 [KR] Rep. of Korea .................. 91-6053

[51] Int. Cl.⁵ .......................................... H01L 21/60
[52] U.S. Cl. .................. 228/123; 228/180.2; 228/175
[58] Field of Search .............. 228/179, 180.2, 175, 228/4.5, 123; 357/71

[56] References Cited

U.S. PATENT DOCUMENTS

| | | | |
|---|---|---|---|
| 5,090,19 | 2/1992 | Tsuda et al. | 228/4.5 X |
| 3,986,255 | 10/1976 | Mandal | 228/123 X |
| 4,661,192 | 4/1987 | McShane | 228/180.2 X |
| 4,750,666 | 6/1988 | Neugebauer | 228/4.5 X |
| 4,875,617 | 10/1989 | Citowsky | 228/180.2 X |
| 4,875,618 | 10/1989 | Hasegawa | 228/179 |
| 4,889,274 | 12/1989 | Ramsey | 228/179 |
| 5,090,609 | 2/1992 | Nakao et al. | 228/123 |

Primary Examiner—Kenneth J. Ramsey
Attorney, Agent, or Firm—Ladas & Parry

[57] ABSTRACT

A semiconductor chip bonding process is disclosed, and the process comprises the steps of forming a first Au ball using a wire ball bump bonding apparatus, stacking a second Au ball on the first Au ball, stacking a Pb ball on the second Au ball using the wire ball bump bonding apparatus, and bonding the chip to a substrate, wherein the conventional complicated BUMP manufacturing process is omitted due to the CHIP BONDING technique during the assembling process, so that the formation process is shortened and the defect rate during the chip bonding is minimized, thereby the manufacturing cost can be saved.

1 Claim, 4 Drawing Sheets

FIG. 2
PRIOR ART
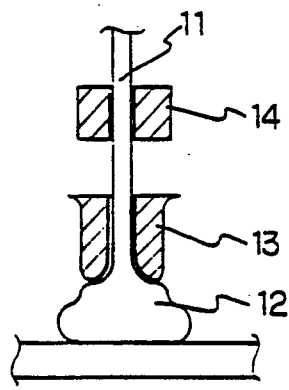
FIG. 3
PRIOR ART
FIG.3(A)
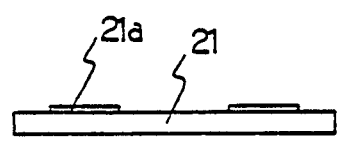
FIG.3(B)
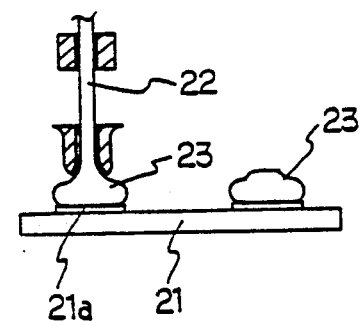
FIG.3(C)
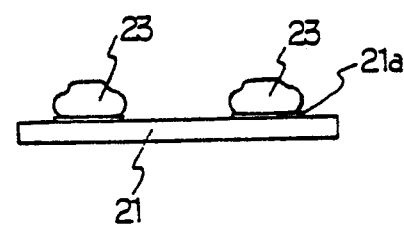
FIG.3(D)
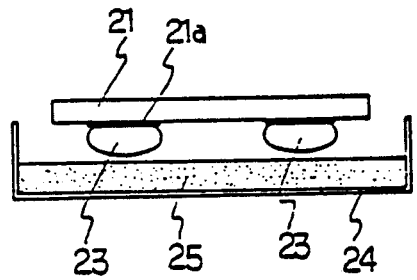
FIG.3(E)
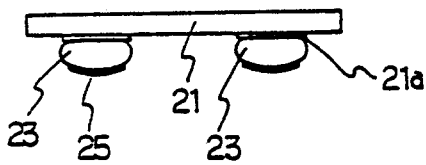
FIG.3(F)

SEMICONDUCTOR CHIP BONDING PROCESS

FIELD OF THE INVENTION

The present invention relates to a semiconductor chip bonding process, in which flip chips are bonded by face-down process in such a manner that bumps are formed on the electrodes of the chip and the integrated circuit is subsequently secured to be faced downwardly on the substrate.

BACKGROUND OF THE INVENTION

Generally, such a flip chip bonding process, which is different from the wire bonding process and the TAB (tape automatic bonding) process, is carried out in such a manner that the bumps for bonding the chip to the substrate are formed in a desired form during a separate step of the semiconductor manufacturing process.

As shown in FIGS. 1A through 1F, the conventional bump forming process comprises a step of sputtering Ti or Cr on an aluminum pad 2 which is formed on a chip 1 so as to form a layer, a step of forming a plating base 3 by depositing Cu or Au on the layer after providing an adhesion thereto, a step of forming photoresists 4 on the plating base 3 to define the size of the bump by the photolithography method, a step of forming a bump 5 by electroplating Pb/Sn or Au, Au/Cu on the space between the photoresists 4, a step of removing the photoresists 4 and the depositions due to the electroplating, and a step of shaping the bump 5 into the desired form by flowing the bump 5 under a hydrogen atmosphere after thermal processes for the bump 5.

In general, bumps for use in the flip chip bonding uses Pb/Sn material.

However, the above described bump forming process is very much complicated, and therefore, it is difficult to apply this process during the assembling process. Accordingly, it is troublesome that the bump forming process has to be carried out in a separate manufacturing process.

Recently, a chip bonding process is processed, where the chip bonding can be carried out during the assembling process as shown in FIGS. 3A through 3F.

As shown in FIG. 2, a wire is passed through a capillary 13 to form a ball 12 on the tip thereof, and the wire is cut with a clamp 14 by a wire ball bump bonding apparatus being used in this process.

As shown in FIG. 3, the process includes: steps b and c of installing an Au wire 22 on the wire ball bump bonding apparatus, and forming an Au ball 23 on an electrode 21a of a chip 21, steps d and e of applying an Ag paste 25 to the Au ball 23 by putting the Au ball 23 into a container 24 filled with the Ag paste 25 and by pulling it out therefrom, and step f of bonding the chip 21 to the substrate 26 downward.

In the above described chip bonding process, there is an advantage that the formation of the Au ball 23 can be formed during the assembling process. However, it still has problems that the Au balls 23 are formed very densely in their intervals, and therefore, when the Ag paste 25 is applied to the Au ball 23, they can be connected to the adjacent Au balls 23. In addition, as the height of bumps is small, it is difficult to apply a suitable Ag paste to the Au ball. It means that an Ag paste on the chip might be connected between the adjacent Au balls 23 as well as between electrodes, and the Ag paste 25 is weak at high temperatures, thereby decreasing the reliability of the product.

SUMMARY OF THE INVENTION

The present invention is intended to overcome the above described disadvantages of the conventional techniques.

Therefore, it is the object of the present invention to provide a chip bonding process in which the Ag paste is not used and the bump is formed during the assembling process without requiring a separate bump forming technology so as to improve the chip bonding efficiency, thereby making it possible to save the manufacturing cost, to prevent the formation of short circuits, and to improve the adhesiveness to a level better than that of the Ag paste.

In order to achieve the above object, the chip bonding process according to the present invention comprises the steps of forming a first Au ball by carrying out an Au wire ball bump bonding on an electrode of a chip with a wire ball bump bonding apparatus, stacking a second Au ball on the first Au ball by carrying out the Au wire ball bump bonding again, forming a Pb ball on the second Au ball by carrying out a Pb wire ball bonding with the wire ball bump bonding apparatus, and carrying out a chip bonding by attaching the chip to a substrate while heating the Pb ball to melt it.

BRIEF DESCRIPTION OF THE DRAWINGS

The above object and other advantages of the present invention will become more apparent by describing in detail the preferred embodiment of the present invention with reference to the attached drawings, in which:

FIG. 2 illustrates the structure of a conventional wire bump bonding apparatus,

FIGS. 3 through FIG. 3F illustrate a conventional chip bonding process; and

DESCRIPTION OF THE PREFERRED EMBODIMENT

The present invention is now described in more detail with reference to the accompanying drawings.

Figure 1A:
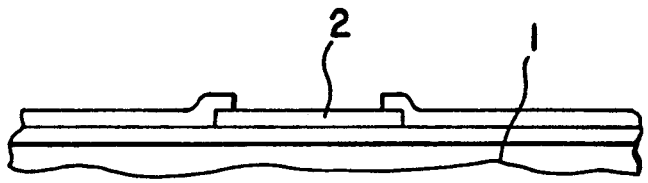
FIGS. 1 through FIG. 1F illustrate the process for formation of a conventional bump.
Figure 1B:
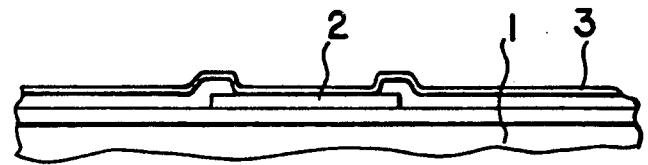
Figure 1C:
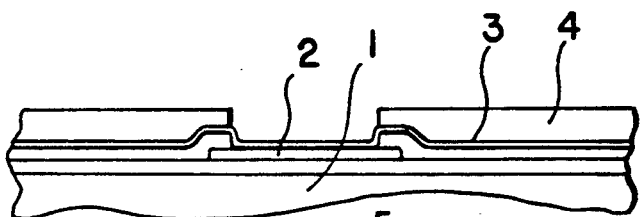
Figure 1D:
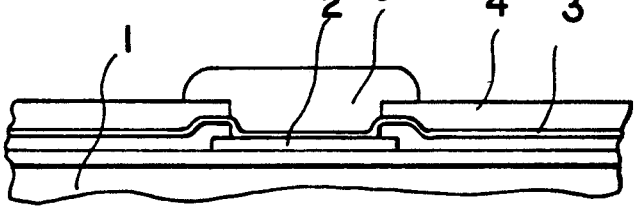
Figure 1E:
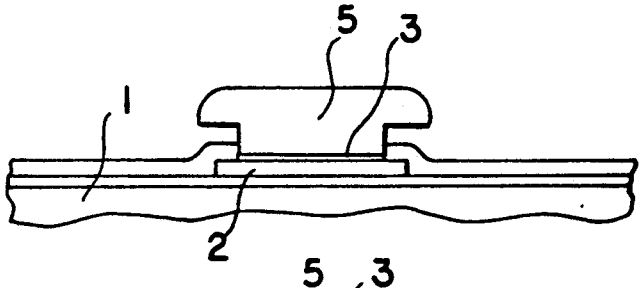
Figure 1F:
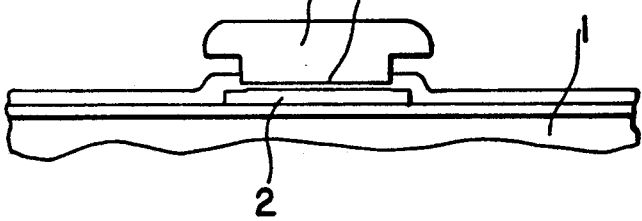
Figure 4A:
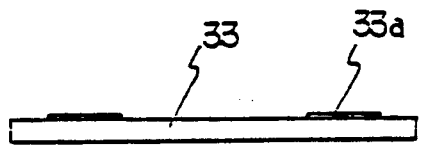
FIGS. 4A through FIG. 4J illustrate a chip bonding process according to the present invention.
Figure 4B:
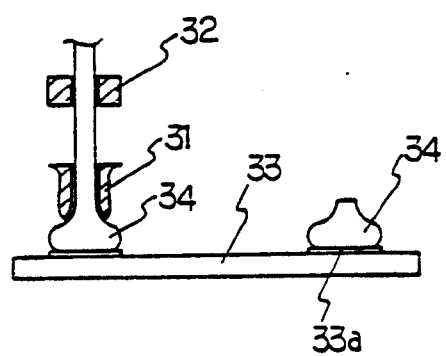
Figure 4C:
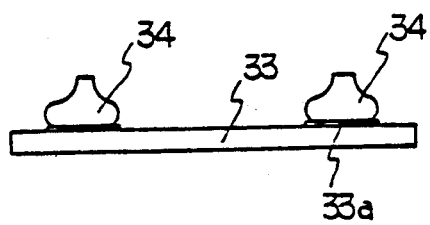
Figure 4D:
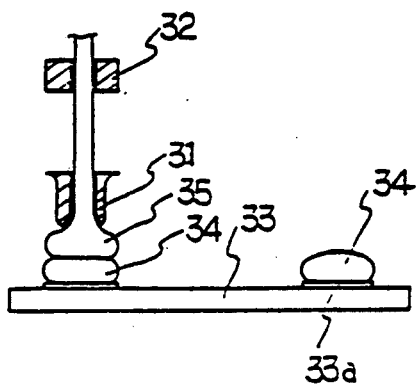
Figure 4E:
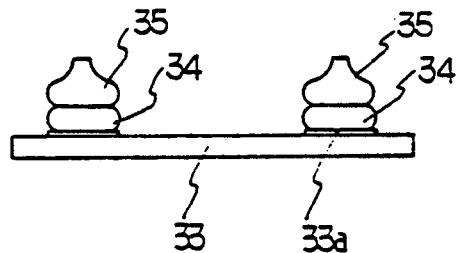
Figure 4F:
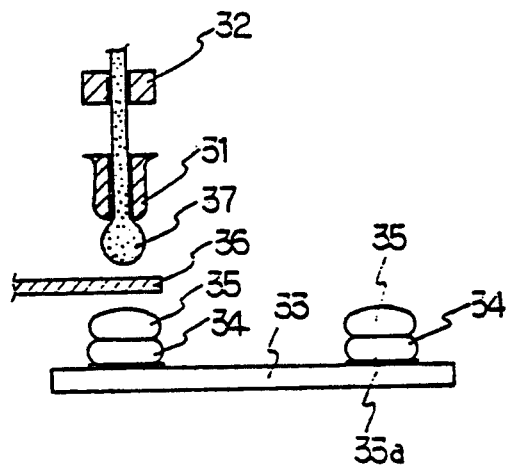
Figure 4G:
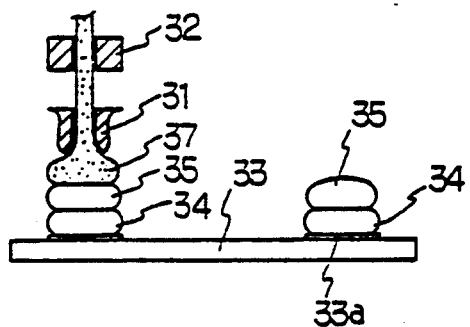
Figure 4H:
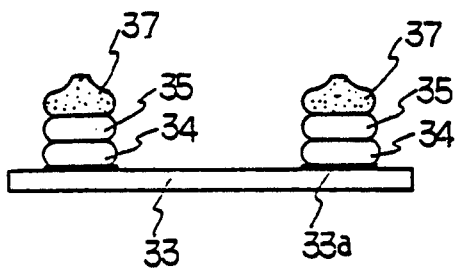
Figure 4I:
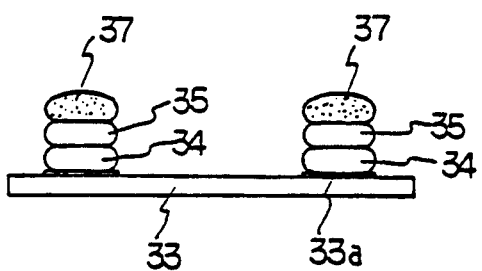
Figure 4J:
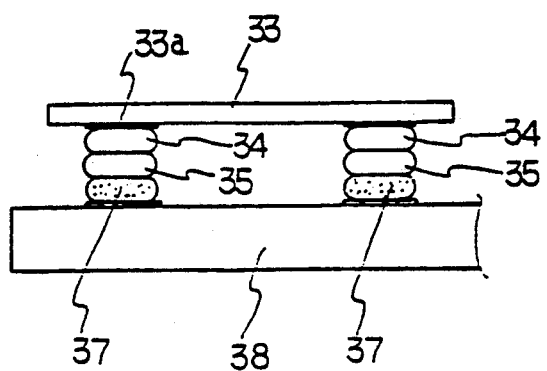

FIGS. 4A through FIG. 4J illustrate a chip bonding process according to the present invention. As shown, the chip bonding process according to the present invention comprises steps b and c of forming a ball on an electrode 33a of a chip 33 by applying a ball bonding process, and forming a first Au ball 34 by carrying out a wire cutting with a wire ball bump bonding apparatus (for cutting the ball neck) and also with a clamp 32 after passing the wire through a capillary 31 to form a ball, and attaching the ball to the electrode of the chip 33, steps d and e of forming a ball again on a first Au ball 34 and stacking a second Au ball 35 by carrying out a second Au wire ball bonding with the ball bump bonding apparatus, and by carrying out a wire cutting, steps f∼i of carrying out a Pb wire ball bonding by the bonding apparatus, and stacking a Pb ball 37 upon the second Au ball 35 under a H2 or an Ar+H2 atmosphere, and a step j of attaching the chip 33 consisting of the first and second Au balls 34, 35, and the Pb ball 37 to a substrate 38, with the chip 33 being faced down, and with the substrate 38 being provided with an input/output pattern.

Here, the Pb ball 37 is heated at the step of attaching the chip 33 to the substrate 38, so that the Pb ball 37 is melted and bonded with the pattern of the substrate 38. Besides the Pb ball 37, any material can be used if is has the similar melting point as that of the Pb ball 37, and if the conductivity is also same.

According to the present invention as described above, the formations of the first and second Au balls 34, 35 and the Pb ball 37 during the assembling process are able to perform by using the known wire ball bump bonding apparatus, and therefore, the bonding efficiency is improved. Further, the diameters of the wires for forming the first and second Au balls 34, 35 and the Pb ball 37 can be reduced, and therefore, extra spaces within the chip can be obtained 7 so that the number of the electrodes 33a of the chip 33 can be increased and the design of the chip is rendered easilier. Furthermore, the Pb ball 37 of low melting point is stacked upon the second Au ball 35, so that a low temperature chip bonding becomes possible. Consequently, the process can be shortened, and the cost can be curtailed. Moreover, the Pb ball 37 is stacked not on the electrode, but on the stacked first and second Au balls, and therefore, the slot defects due to the Ag paste applied on the Au ball in the conventional method is not occurred any more.

According to the present invention as described above, the complicated BUMP manufacturing process is omitted by using the CHIP BONDING technique during the assembling process, and thus, the process can be shortened and that the defect rate during the chip bonding is minimized, thereby increasing the yield and saving the manufacturing cost.

What is claimed is:

1. A semiconductor chip bonding process comprising the steps of:
    forming a first Au ball by carrying out an Au wire ball bump bonding on an electrode of a chip with a wire ball bump bonding apparatus;
    stacking a second Au ball on said first Au ball by again carrying out said Au wire ball bump bonding step;
    forming a Pb ball on said second Au ball by carrying out a Pb wire ball bump bonding with said wire ball bump bonding apparatus; and
    carrying out a chip bonding by attaching said chip to a substrate by means of a Pb bond formed from said Pb ball by heating said Pb ball to melt it.

* * * * *